United States Patent
Cook et al.

(12) 
(10) Patent No.: US 6,782,355 B1
(45) Date of Patent: Aug. 24, 2004

(54) APPARATUS FOR IMPROVING CONCURRENT BEHAVIOR MODELING WITH EMULATION

(75) Inventors: Robert Bryan Cook, Poughkeepsie, NY (US); Angelo Salvatore Grimaldi, Red Bank, NJ (US); Jeffrey Joseph Ruedinger, Rochester, NY (US)

(73) Assignee: Quickturn Design Systems, Inc., San Jose, CA (US)

( * ) Notice: Subject to any disclaimer, the term of this patent is extended or adjusted under 35 U.S.C. 154(b) by 0 days.

(21) Appl. No.: 09/523,053

(22) Filed: Mar. 10, 2000

(51) Int. Cl.[7] .............................................. G06F 9/455
(52) U.S. Cl. ........................................ 703/23; 703/14
(58) Field of Search .............................. 703/23, 24, 27, 703/28, 25, 22, 14; 714/30, 28; 710/36, 32; 717/227, 4

(56) References Cited

U.S. PATENT DOCUMENTS

| | | | | |
|---|---|---|---|---|
| 4,006,465 A | * | 2/1977 | Cross et al. ................... | 710/36 |
| 5,911,059 A | * | 6/1999 | Profit, Jr. ..................... | 703/23 |
| 5,946,472 A | | 8/1999 | Graves et al. | |
| 6,041,176 A | * | 3/2000 | Shiell .......................... | 703/27 |
| 6,546,505 B1 | * | 4/2003 | Swaboda et al. ............. | 714/30 |

* cited by examiner

*Primary Examiner*—Samuel Broda
*Assistant Examiner*—Kandasamy Thangavelu
(74) *Attorney, Agent, or Firm*—Orrick, Herrington & Sutcliffe LLP

(57) ABSTRACT

A hardware design emulation system that includes one or more emulators and one or more associated run-time assist units (RTAUs). The emulator logic is a combination of user model logic, reflecting the hardware design, and non-user model logic. A handshaking controller produces a domain step signal and a model step signal. The domain step signal indicates that the emulator is entering a state for executing the next step of the logic with which it is programmed, be it user model logic or non-user model logic. The model step signal indicates that the emulator is entering a state for advancing the user model defined by the user model logic. This dual handshaking protocol enhances versatility by enabling a wide variety of RTAUs to be used, particularly in combination with one another. Also, a RTAU can, in accordance with its programming, "skip steps" (either model steps or domain steps) to enhance efficiency if there is a known relationship between cycles of the emulator logic and cycles of the user model. In addition, system stoppage logic efficiently alerts other RTAUs when one RTAU has caused the emulation to stop. Furthermore, the emulation system can be scaled to accommodate a greater number of RTAUs by cascading the master panels to which they are connected.

10 Claims, 13 Drawing Sheets

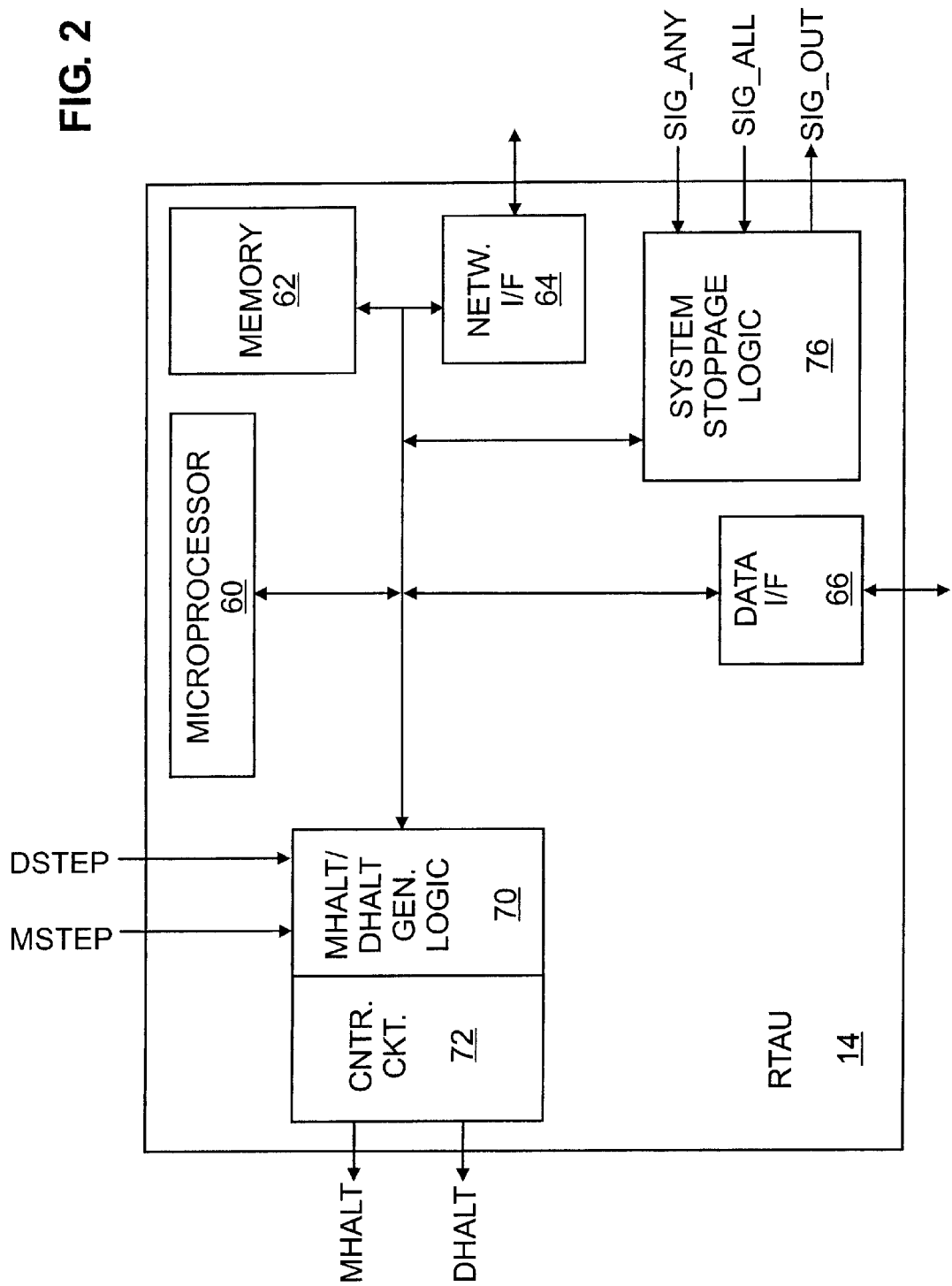

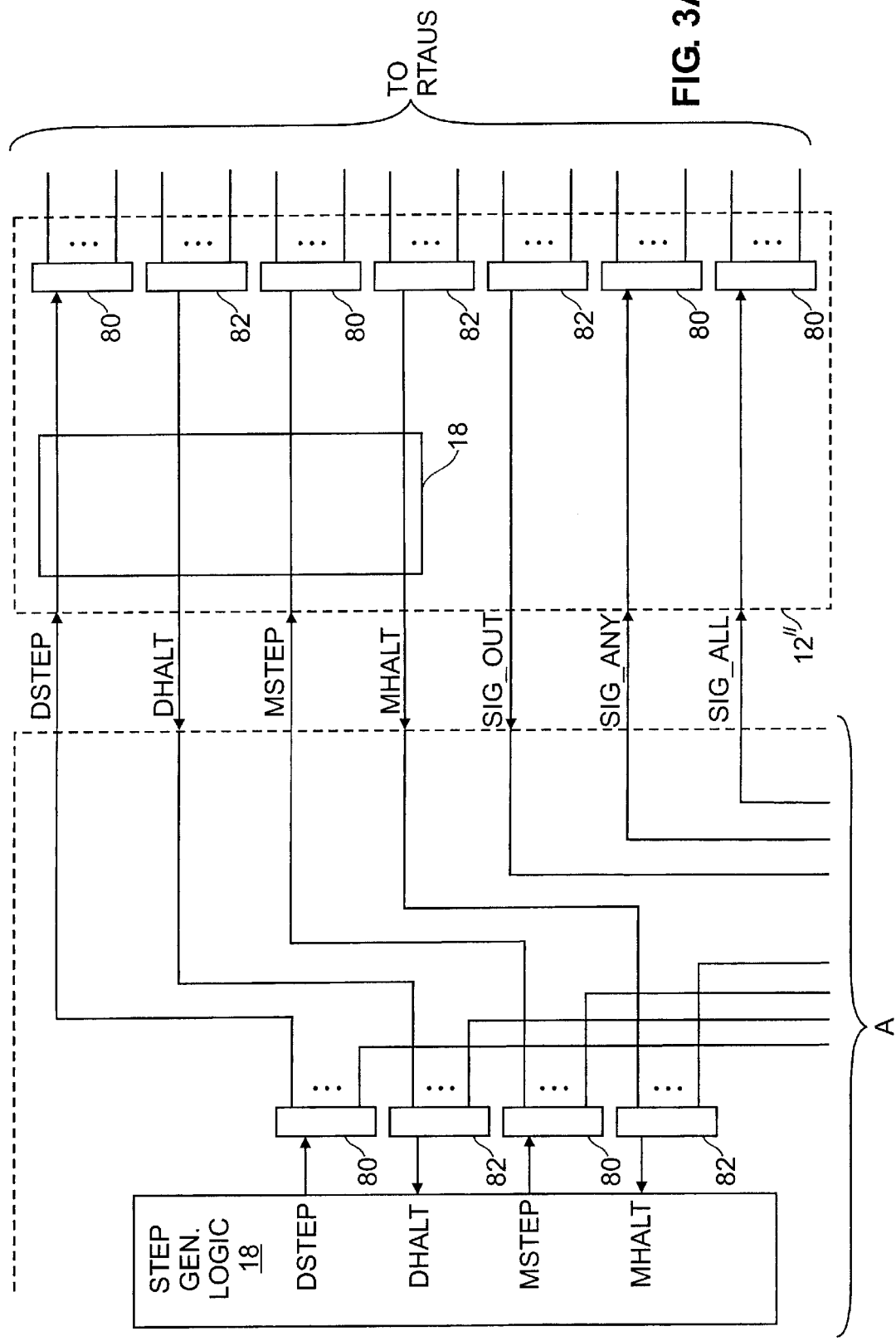

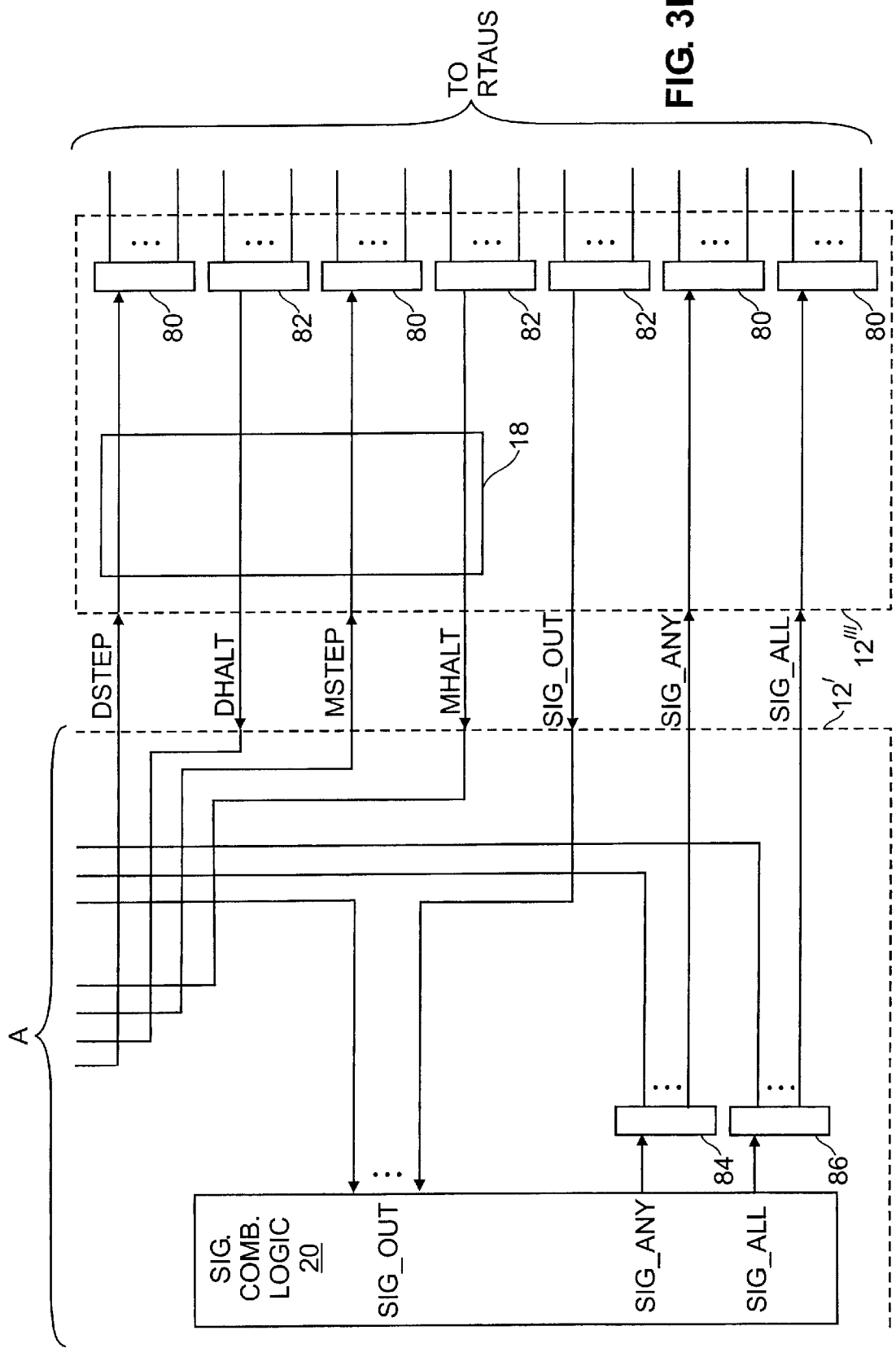

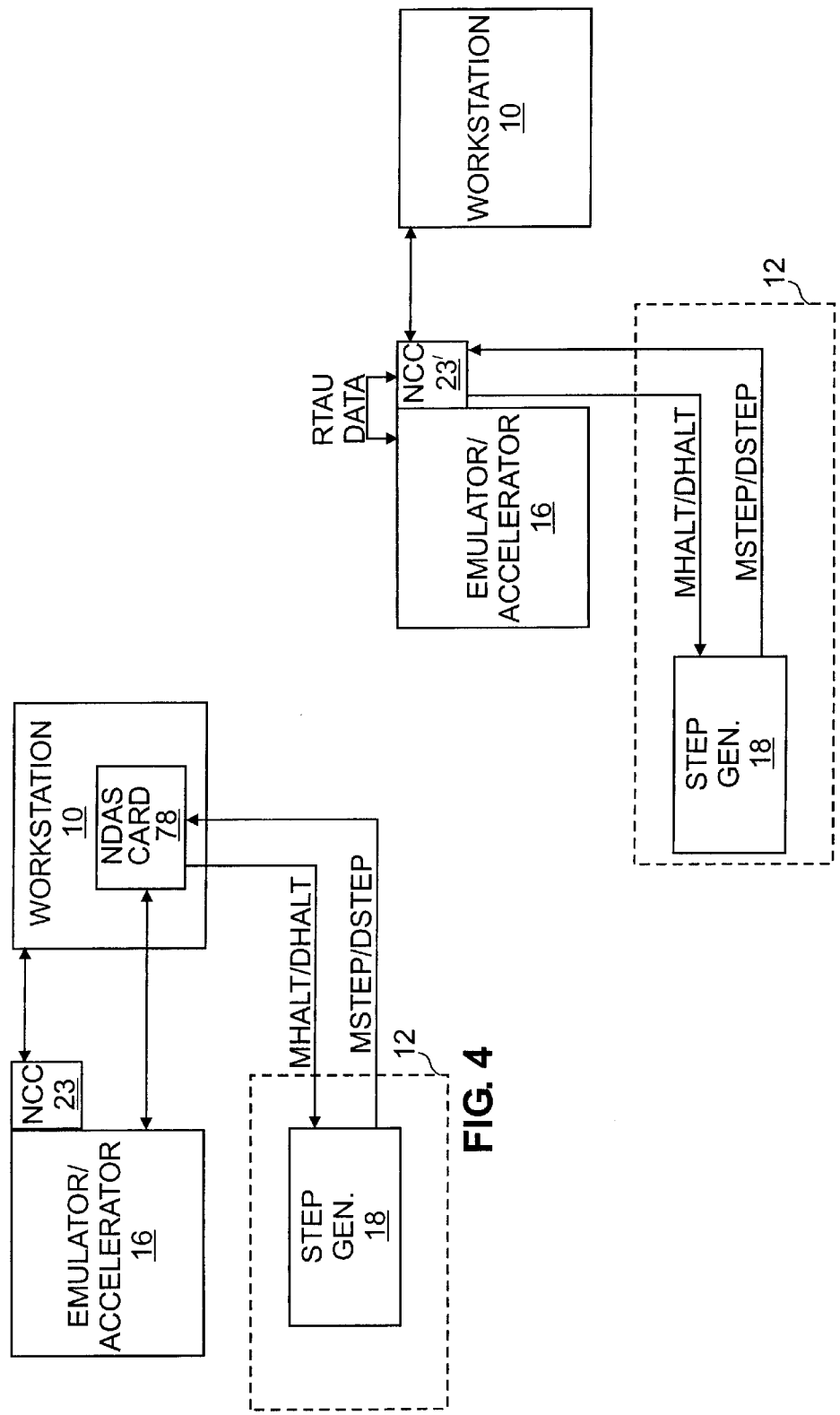

APPARATUS FOR IMPROVING CONCURRENT BEHAVIOR MODELING WITH EMULATION

BACKGROUND OF THE INVENTION

1. Field of the Invention

The present invention relates generally to electronic systems modeling and development and, more specifically, to hardware simulators and emulators.

2. Description of the Related Art

Electronics engineers and others who design electronic systems use simulators and emulators to test their designs for both operability and compatibility with existing systems or components with which they are to interface. A simulator is commonly a general-purpose computer workstation that runs a simulation program. The program models or simulates in software the circuits of the design to be evaluated, simulates application to the circuit of the requisite input signals, and outputs the data representing the resulting output signals that the circuit produces in response to the input signals.

As described in U.S. Pat. No. 5,946,472, issued to IBM Corporation and incorporated into this patent specification in its entirety by this reference, simulators by themselves have been found to be relatively inefficient because the concurrent operations they simulate typically create a bottleneck in terms of processing speed. Concurrent operations are those that model the circuit logic, and typically account for approximately 90% of the available processing load on the workstation; sequential operations, which are those that apply test vector data and otherwise simulate sequentially occurring activities with respect to the simulation, typically account for the remaining approximately 10% of the processing load on the workstation. To help alleviate this bottleneck, accelerator hardware can be interfaced with a workstation. An accelerator is typically an electronic circuit board system that performs the concurrent processing, thereby taking that portion of the load off the workstation. The workstation can then concentrate the majority of its available processing power on sequential operations.

A further improvement in processing efficiency can be gained by providing an emulator or an emulator/accelerator combination. An emulator/accelerator is a large-scale hardware configuration typically implemented in field-programmable gate arrays (FPGAs) or some other type of software-configurable custom hardware. Because the logic is modeled in hardware (e.g., FPGAs) that approaches the same degree of parallel operation that the actual circuit being modeled would exhibit, the emulator/accelerator can perform the concurrent operations much faster than an accelerator alone. The emulator/accelerator is capable of emulating many types of computer system hardware and other logic, including, for example, memory devices. An example of an emulator/accelerator is the ETX produced by IBM Corporation. The ETX executes a logic model embodied in suitable software that reflects a combination of a user model logic portion and non-user-model logic portion. The user model logic portion may be derived from (e.g., compiling) a netlist for the hardware design under test. Accordingly, this portion represents the functionality of the hardware design. The non-user-model logic portion is peripheral to the hardware design itself and is included for the purpose of providing peripheral functions to the emulation, such as high-speed multiplexed data communication between the emulator/accelerator and a host workstation.

The chief advantage of including an emulator/accelerator is that it can perform the concurrent operations in parallel with the sequential operations performed by the workstation to which it is connected. In some cases, an emulator/accelerator can be interfaced to target hardware representing a portion of the system that is being tested or otherwise evaluated. For example, the target hardware may be a personal computer in which the microprocessor has been removed and replaced with a cable connecting it to the emulator/accelerator.

The above referenced patent describes an improved emulator/accelerator system that includes one or more "behavior cards" for performing the sequential operations, thereby taking that portion of the load off the workstation. The behavior card is quite versatile and can apply test vectors or model sequential devices such as a memory. Thus, the emulator/accelerator performs the concurrent operations while the behavior card performs the sequential operations. The two can operate in parallel. Nevertheless, the two do not operate asynchronously with each other. Rather, they are synchronized with each other and operate in lock-step fashion by means of a handshake. On each cycle of the emulation, the emulator/accelerator produces a "STEP" or "BEGIN_CYCLE" signal. In response to this signal, the behavior card generates a "HALT" signal, which indicates that the behavior card has begun processing data it received from the emulator/accelerator on the previous cycle and needs the emulator/accelerator to wait until it has finished doing so. When it has finished, the behavior card drops the HALT signal. In response to the deassertion of the HALT signal, the emulator/accelerator can reassert the STEP signal when it is ready to begin another emulation cycle. In addition, if the behavior card asserts the HALT signal but detects an error condition, requires more input data before it can continue, or otherwise needs to suspend the emulation, it can assert a "STOPPED" signal. This signal provides an indication of such a condition to the workstation and to any other behavior cards in the system. While improving the processing time of an embedded simulation environment, there are still improvements that can be made to the processing efficiency, especially when peripherals beyond the behavior card are used. Moreover, in accordance with the present invention it has been recognized that there are circumstances under which processing efficiency can be improved by improving and refining the handshaking protocol and the protocol under which the behavior card can suspend processing via the STOPPED signal. The present invention addresses these problems and deficiencies and others in the manner described below.

SUMMARY OF THE INVENTION

The present invention relates to a hardware design emulation system that includes an emulator or emulator/accelerator and one or more run-time assist units (RTAUs) that may include (but are not limited to) the behavior cards described in above-described U.S. Pat. No. 5,946,472. The emulator/accelerator executes a logic model that reflects a combination of a user model logic portion and a non-user-model logic portion In one aspect, the invention further includes a handshaking controller that produces a domain step signal and a model step signal. The domain step signal indicates that the emulator is entering a state in which it is executing the next step of its emulation cycle. The domain step may or may not advance the user model. For example, the user model may not advance if the next step is merely communicating data with the host workstation or performing some other task defined by the non-user-model logic portion of the logic model. The model step signal indicates that the emulator is entering a state in which it is advancing the user model executing on the emulator/accelerator and associated RTAU (s).

Various types of RTAUs can be included. Such RTAUs can respond to combinations of the domain step signal and model step signal in different ways, thereby enhancing versatility in terms of the types of RTAUs that can be included in the system, especially as used in combination with one another in the same emulation. The behavior card described in U.S. Pat. No. 5,946,472 is an example of one type of RTAU. It includes a processor on which a user model program executes. Another type of RTAU is a network-based direct attach stimulus (NDAS) card, which moves data directly between the emulator and the workstation.

Depending upon the type of RTAU, it can respond to either the domain step signal, the model step signal or both. For example, a behavior card of the type described in the above-referenced patent does not distinguish between domain step signals and model step signals; it cant be programmed to respond to one, the other, or either signal. Each time the handshaking controller asserts the appropriate step signal, the behavior card advances the user model by performing the requisite processing in accordance with the next step of its programming. To indicate that it has begun such processing, it asserts an appropriate halt signal. Thus, it asserts a domain halt signal in response to the domain step signal, and asserts a model halt signal in response to the model step signal. When it has completed its processing, it deasserts the appropriate halt signal to indicate such completion.

In contrast, an NDAS card operates in response to both the domain step signal and the model step signal. In typical operation, when the handshaking controller asserts the domain step and model step signals, the NDAS card responds by asserting the domain and model halt signals and beginning a transfer of data. When it has completed the initial data transfer it deasserts the domain halt signal but may keep the model halt signal asserted if more data is to be transferred. The handshaking controller then reasserts the domain step signal, and the NDAS card responds by reasserting the domain halt signal; with each such domain step/halt handshake, the NDAS card transfers more data. When the NDAS card has no more data to transfer, it can deassert the model halt signal. Still other types of RTAUs can respond to combinations of the domain and model step signals in other ways, thereby providing an extremely versatile interface.

In accordance with another aspect of the invention, a RTAU may include a programmable counter circuit that causes it to skip steps. In other words, the counter can be programmed so that the RTAU does not assert the halt signal in response to every step signal; rather, the RTAU can assert the halt signal in response to every $n^{th}$ step signal. For example, the RTAU may respond to every other assertion of the step signal or every third assertion of the step signal, and so forth. This feature is useful in instances in which the emulated model is known to produce a usable output only every $n^{th}$ model step or every $n^{th}$ domain step.

In another aspect, the invention further includes signals that indicate to the RTAUs when another RTAU has suspended execution. Any of the RTAUs produces an output signal to indicate it has suspended execution. Each RTAU receives a "Signal_Any" signal indicating that another RTAU asserted its output signal and a "Signal_All" signal indicating that all of the RTAUs asserted their output signals. Each RTAU asserts its output signal in response to detecting assertion of the "Signal_Any" signal. An OR-based logic network combines the output signals produced by the RTAUs to form "Signal_Any." An AND-based logic network combines the output signals produced by the RTAUs to form "Signal_All."

The emulators may be connected together to a central unit, referred to as a master panel, that provides interconnections for the emulator/accelerator boards, RTAUs, host workstation and other devices. The step generation circuitry and logic network for the "Signal Any" and "Signal_All" signals may be included in the master panel logic. In another aspect of the invention, multiple master panels may be cascaded together to form a global master panel that accommodates many more emulator/accelerators and RTAUs than a single master panel. Although each master panel includes the step generation circuitry, only that of one of the master panels, referred to as the primary master panel, is actively used in the global master panel configuration; the step generation circuitry of the other, cascaded or secondary master panels is bypassed and inactive. Each secondary master panel has splitter circuitry that splits or distributes the step signals it receives from the primary master panel or from another secondary master panel between it and the primary master panel. Each secondary master panel also has combiner circuitry that combines the halt signals it receives from the RTAUS or from another secondary master between it and the RTAUs. At least from the perspective of a single user's emulation, the RTAUs associated with that emulation are connected to the last level of secondary master panels and are not connected to the primary master panel or to intermediate levels of secondary master panels.

The foregoing, together with other features and advantages of the present invention, will become more apparent when referring to the following specification, claims, and accompanying drawings.

BRIEF DESCRIPTION OF THE DRAWINGS

For a more complete understanding of the present invention, reference is now made to the following detailed description of the embodiments illustrated in the accompanying drawings, wherein:

FIG. 2 is a block diagram of a run-time assist unit of the system;

FIG. 3 comprising FIG. 3A and FIG. 3B is a block diagram of a global master panel for the system;

FIG. 4 is a block diagram of an alternative configuration of the emulation system;

FIG. 5 is a block diagram of another alternative configuration of the emulation system;

DESCRIPTION OF A PREFERRED EMBODIMENT

Figure 1A:
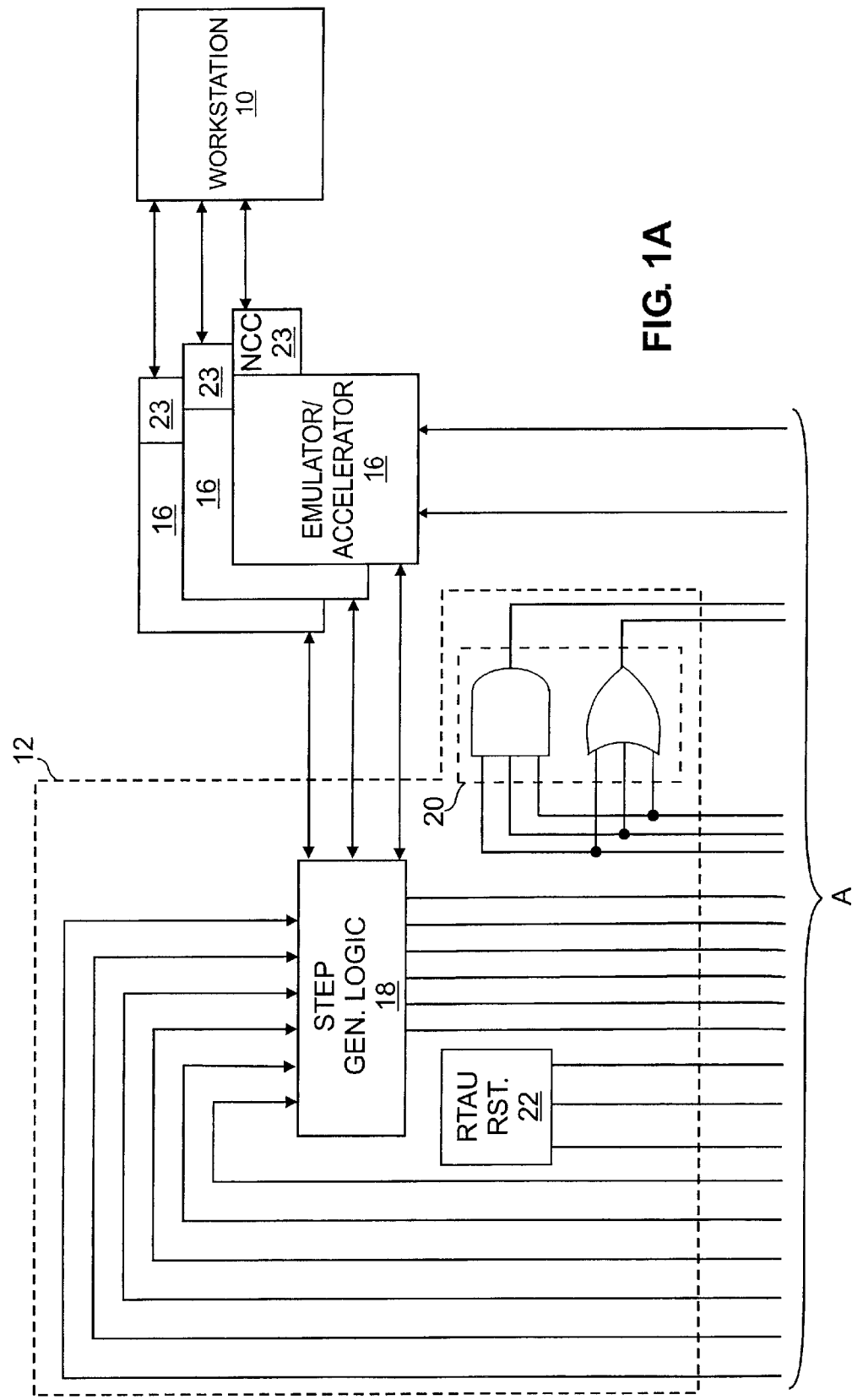
FIG. 1 comprising FIG. 1A
FIG. 1B is a block diagram of an emulation system.
Figure 1B:
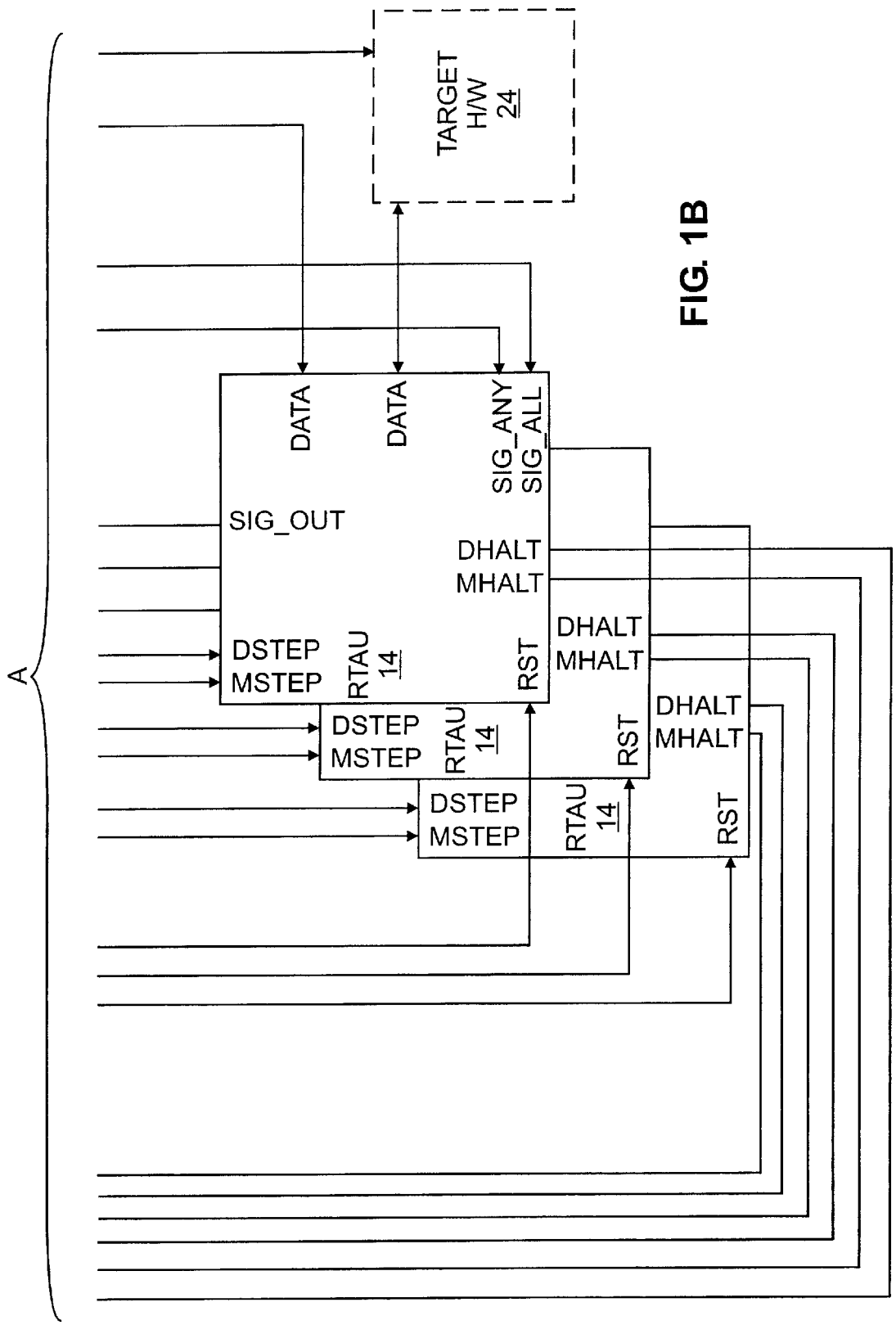

As illustrated in FIG. 1, in one embodiment of the invention a system for emulating a hardware design includes a host workstation 10, a master panel 12 and one or more run-time assist units (RTAUs) 14. Host workstation 10 may be any suitable type of computer that has the capability of executing or running hardware design simulation and emulation programs of the type known in the art. One or more emulator/accelerator boards 16 are connected to master panel 12. Master panel 12, emulator/accelerator boards 16 and RTAUs 14 may be mounted within a suitable enclosure (not shown) that provides power and mechanical framework. Master panel 12 further includes step generator logic 18, signal combiner logic 20, and RTAU reset logic 22. A user operates workstation 10 to control the emulation by means of a suitable control program. Under control of the program, workstation 10 can provide input data to the emulation, receive the output data (results) of the emulation, and display the output in a manner that is meaningful to the user, such as in the form of timing diagrams on a graphical display (not shown). A networked control card 23 coupled to each emulator/accelerator 16 provides the interface with workstation 10 and performs other functions, such as propagating certain signals between emulator/accelerator 16 and master panel 12. Although not illustrated for purposes of clarity, the system may include more than one workstation 10 so that multiple users can run their emulations in parallel to some extent. In such an environment, one of the workstations can be designated as a main host that manages the various users and controls the assignment of emulator/accelerators 16 and associated RTAUs 14 to the various users' emulations and release of emulator/accelerators 16 and associated RTAUs 14 from their emulations when completed. For purposes of clarity, the description in this patent specification pertains to the instance in which a single user is performing a single emulation, and the structures and functions are described from that perspective. Furthermore, as described in further detail below, by cascading multiple master panels 12 into a global master panel, the system can be expanded to include even more emulator/accelerators 16 and associated RTAUs 14 in the same emulation (user model).

Emulator/accelerators 16 are described in U.S. Pat. No. 5,946,472 and are preferably of the type produced by IBM Corporation under the name "ETX" (versions have included ET3.0, ET3.5, etc.). The ETX logic is primarily embodied in a single chip, but emulator/accelerator 16 may be implemented in any suitable combination of chip-level hardware and board-level hardware. In the above-referenced patent, an improvement was described wherein the ETX processed the concurrent operations in an emulation, and a behavior card processed the sequential operations. In accordance with the present invention, RTAUs 14 may be such behavior cards, but they may alternatively be other types of devices, as described in further detail below. In embodiments of the invention in which RTAUs 14 are behavior cards, they may interface with target hardware 24 which is typically a portion of the hardware design under test, i.e., being emulated. In any event, emulator/accelerator 16 communicates with workstation 10 via a network connection, and communicates emulation data with RTAUs 14 and any target hardware 24. It further communicates information with step generator logic 18 that enables generation of the signals described below in proper timed relation to the emulation cycles.

As described in the above-referenced patent, synchronization circuitry asserted a step signal or "BEGIN_CYCLE" signal to indicate that the ETX is ready to begin another emulation cycle. In response, the behavior card asserts a "halt" signal. The halt signal indicated to the ETX to wait until the behavior card completed its user model cycle before continuing with the next step pulse. This simple handshaking protocol kept the EXT and behavior card in synchronization in a lock step fashion. In accordance with the present invention, it has been recognized that in not all instances does assertion of the step or BEGIN_CYCLE signal cause the user model to advance. Normally, the signal provided no information beyond that the ETX was entering in a state in which it was executing the next step of its programming. The next step could be defined by user model logic or non-user-model logic. As noted above, user-model logic is that which reflects the netlist describing the hardware design under test (emulation) and is typically created by compiling a netlist. The compiled code, when programmed into the EXT logic, thereby defines what is referred to in this patent specification as the user-model logic or the user-model logic portion of its overall programming. If the next step of its programming reflects user-model logic, executing that step advances the state of the user model. Nevertheless, the next step of the ETX programming could alternatively reflect non-user-model logic. Executing a step that reflects non-user-model logic does not advance the state of the user model. Non-user-model logic can be created by transformation functions invoked during the model compilation process, inserted into the design database using application program interface (API) calls that can add or delete gates and likewise modify gate connections. For example, non-user-model logic can be used to perform high-speed multiplexed communication of data between the user model and host workstation 10. As another example, non-user-model logic can be used to implement a counter that timestamps data captured from the emulation in a buffer for easier manipulation and review. After the user-model logic is obtained by compiling the netlist and the non-user-model logic is added, a transform program is used to combine them into the combined code with which emulator/accelerators 16 are actually programmed.

In accordance with the present invention, it has been recognized that it is useful for a RTAU 14 to receive information that identifies whether or not the next step of the emulation advances the user model. In the above-described prior system, the behavior card needed to keep track itself of whether its user model was advanced or not because it received no such information. Rather, it received only a BEGIN_CYCLE or step signal. Improving upon this handshaking protocol in accordance with the present invention, the step or BEGIN_CYCLE signal is replaced with two signals: "DSTEP" and "MSTEP". Step generator logic 18 asserts DSTEP under essentially the same circumstances described in the above-referenced patent, i.e., each time emulator/accelerators 16 are entering a mode in which they execute the next step of their programming. (The name "DSTEP" is derived from the term "domain step.") DSTEP is thus asserted whether or not the user model is advanced. However, step generator logic 18 asserts MSTEP only when it expects, i.e., desires to enable, the user model to advance. (The name "MSTEP" is derived from the term "model step.")

Likewise, in accordance with the present invention, the HALT signal described in the above-referenced patent is replaced with two signals: "DHALT" and "MHALT". In the case where RTAU 14 is a behavior card of the type described in the above-referenced patent, RTAU 14 responds to assertion of DSTEP and MSTEP in essentially the same manner described therein. That is, it asserts DHALT in response to DSTEP and asserts MHALT in response to MSTEP.

Figure 8:
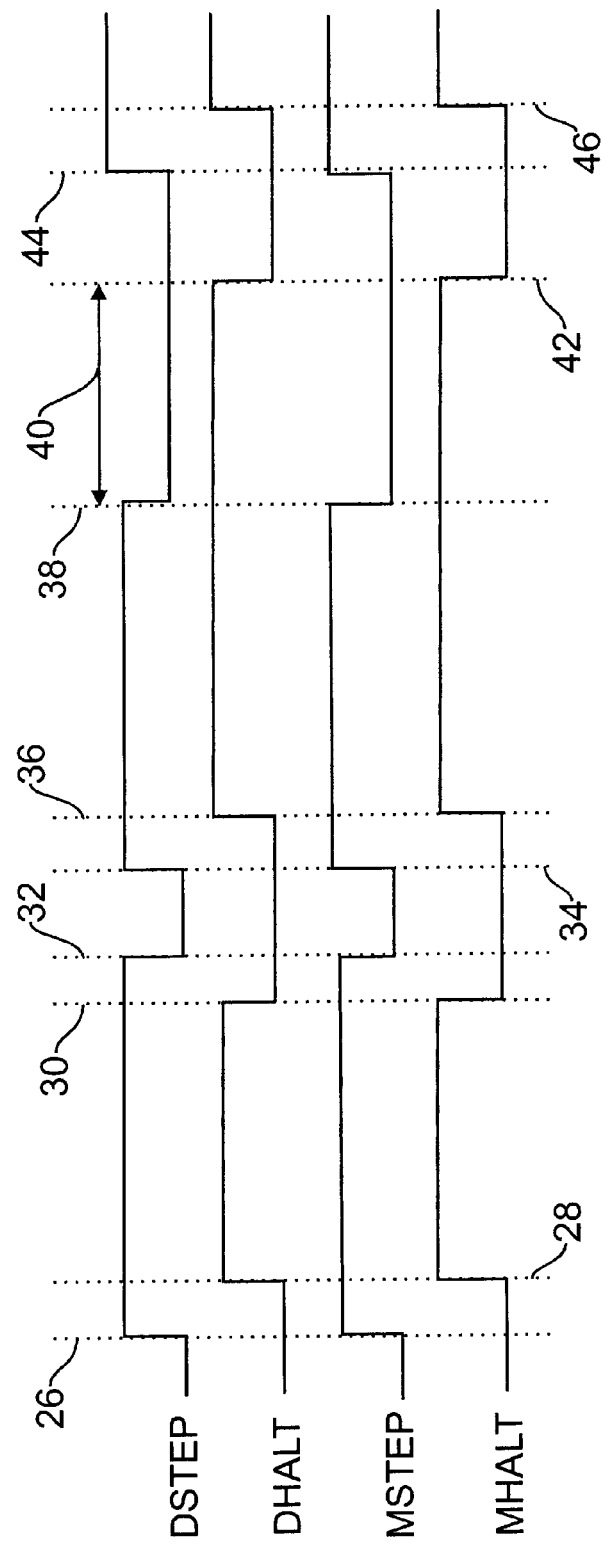
FIG. 8 is a timing diagram illustrating operation of the step and halt signals.
Figure 9A:
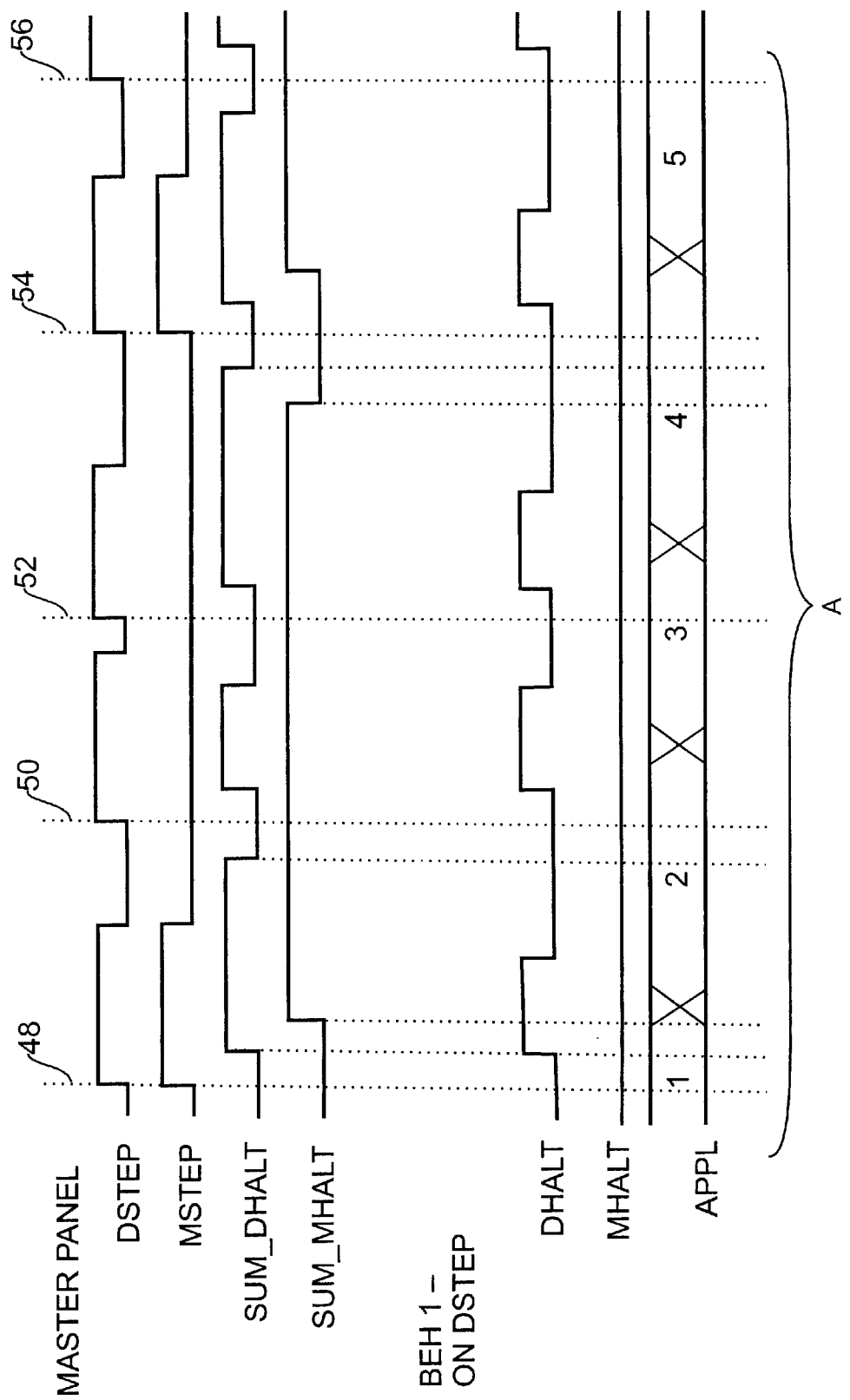
FIG. 9 comprising FIG. 9A
FIG. 9B is a timing diagram illustrating operation of a multiple-RTAU emulation environment.
Figure 9B:
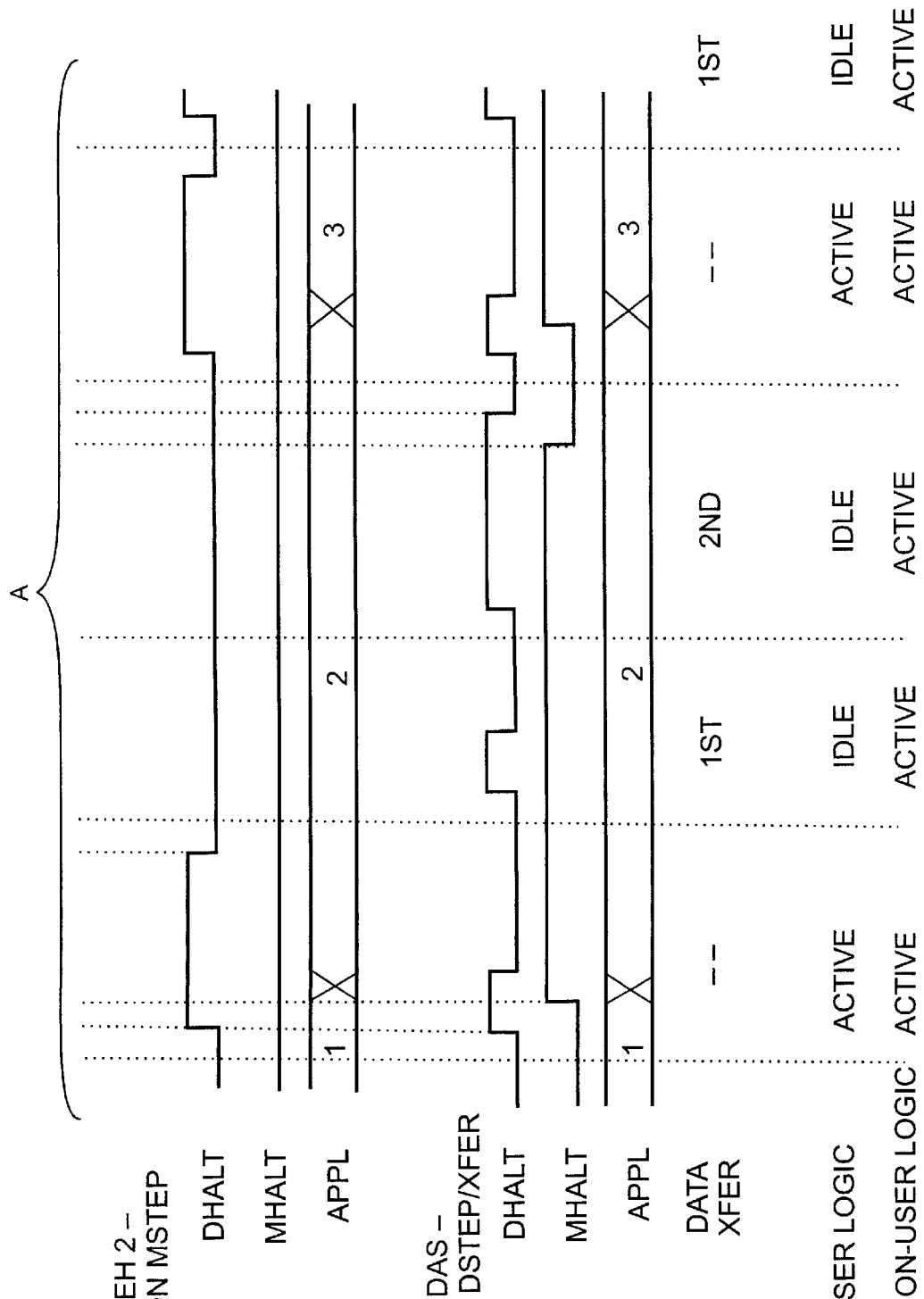

Exemplary timing relationships among DSTEP, MSTEP, DHALT and MHALT are illustrated in FIGS. 8 and 9. In FIG. 8, which represents an embodiment in which RTAU 14 is a behavior card that responds to both DSTEP and MSTEP, step generator logic 18 asserts DSTEP (and in this example also, but need not in every case, asserts MSTEP simultaneously) at time 26. In response RTAU asserts DHALT (and, in this example also, but need not in every case, asserts MHALT simultaneously) at time 28. At time 30, RTAU deasserts DHALT and MHALT to indicate that it has completed its processing of a user model step. At time 32, step generator logic 18 deasserts DSTEP and MSTEP in preparation for the next cycle. At time 34 step generator logic 18 again asserts DSTEP and MSTEP to indicate the beginning of another cycle, and RTAU 14 responds by asserting DHALT (and MHALT) at time 36. Note that at time 38 step generator 18 deasserts DSTEP and MSTEP to indicate that the logic model has completed its processing, but RTAU 14 has not deasserted DHALT and MHALT because it has not yet completed its processing. Some time 40 later, it finally deasserts these signals at time 42. In response, step generator logic 18, ready to begin another emulation cycle, again asserts DSTEP and MSTEP at time 44. At time 46 RTAU 14 again asserts DHALT and MHALT in response. This protocol is like that described in the above-referenced patent, except that two signals, DSTEP and MSTEP, are used in place of a single STEP or BEGIN_CYCLE signal, and two other signals, DHALT and MHALT, are used in place of a single HALT signal.

An exemplary RTAU 14 of the behavior card type is illustrated in further detail in FIG. 2. It includes a microprocessor 60 and an associated memory 62 for holding program instructions and data. The program is the user model and may model a portion of the hardware design, such as a memory. It further includes a network interface 64 for communicating with workstation 10. Although not illustrated in FIG. 1 for purposes of clarity, such direct communication between RTAU 14 and workstation 10 may be beneficial under some circumstances. Also included is a data input/output interface circuit 66 that bidirectionally latches, buffers and conditions data signals communicated with emulator/accelerator 16 and any target hardware 24. RTAU 14 further includes MHALT/DHALT logic 70 that generates MHALT and DHALT in response to MSTEP and DSTEP. A counter circuit 72 associated with MHALT and DHALT logic 70 provides a "step-skipping" feature that is described below. System stoppage logic 76 relates to a protocol for stopping the emulation that is also described below.

Although a behavior card such as that illustrated in FIG. 2 is a preferred type of RTAU, other types are also useful. Any device that complies with the RTAU signal protocols described above that relate to the MSTEP and MHALT signal pair or the DSTEP and DHALT pair is considered a RTAU for purposes of this patent specification. Preferably, a RTAU also complies with the protocol that relates to the SIGNAL_ANY and SIGNAL_ALL pair. For example, as illustrated in FIG. 4, the RTAU may be a network-based direct-attach stimulus (NDAS) card 78. An NDAS card moves data directly between emulator/accelerator 16 and workstation 10 using time-multiplexed I/O during a DSTEP without an MSTEP. In typical operation, the NDAS card responds to assertion of DSTEP and MSTEP by asserting DHALT and MHALT and beginning a transfer of data. When it has completed the initial data transfer it deasserts DHALT signal but may keep MHALT asserted if more data is to be transferred. For example, the FIFO on the NDAS that held the data before it was transferred may not yet be empty, in which case it is necessary to transfer more data. While MHALT remains asserted, the handshaking controller does not again assert MSTEP. Rather, the handshaking controller reasserts DSTEP, to which the NDAS card responds by reasserting DHALT; with each such successive DSTEP/DHALT handshake, the NDAS card transfers more data. When the NDAS card has no more data to transfer, it can deassert MHALT. Although not illustrated, embodiments may include a combination of NDAS cards and behavior card RTAUs.

Advantages of replacing the single pair of handshaking signals described in the above-referenced patent with two pairs in accordance with the present invention can be seen with reference to the timing diagram of FIG. 9. In FIG. 9, handshaking in an exemplary emulation system in which the participating RTAUs consist of two behavior cards ("BEH 1" and "BEH 2") and a NDAS card. In contrast to this system, the system described in the above-referenced patent could not allow both a behavior card and a NDAS card to participate in the same emulation. In FIG. 9, in addition to MSTEP and DSTEP, signals SUM_DHALT and SUM_MHALT are shown, which represent the combination (logical-OR) of all DHALT and MHALT signals, respectively, from all RTAUs. Also shown is a signal "Appl", which represents the application data output by the RTAUs to the emulator/accelerator.

At time 48 in the emulation, the first emulation cycle occurs. The first behavior card, which is synchronized on DSTEP (alternatively, in another example it could be programmed to synchronize on MSTEP), updates its application, then deasserts DHALT when finished to indicate it is ready for the next cycle. (The first behavior card application can be, for example, a simple counter for purposes of illustration.) The second behavior card, which is synchronized on MSTEP (alternatively, in another example it could be programmed to synchronize on DSTEP), detects the rising edge of MSTEP, updates its behavior application (e.g., another counter), and deasserts MHALT when finished to indicate it is ready for the next cycle. Note that the length of time the second behavior card keeps its MHALT active (asserted) differs from that which the first behavior card keeps its DHALT active. This may be normal because the application code on the second behavior card is different from that on the first behavior card and, in this example, takes longer to execute. Meanwhile, the NDAS card, which is synchronized on DSTEP, is assumed to be ready to advance its user model. Once it detects assertion of MSTEP, though, it knows it must communicate data with the emulator/accelerator on the next two DSTEPs. Therefore, it asserts its MHALT before deasserting its DHALT. This indicates to the master panel step generator that it can proceed with the next DSTEP, but not to issue an associated MSTEP.

By time 50, the DHALTs from all sources have been deasserted. The step generator issues the next DSTEP. Because at least one MHALT source is still asserted, though, no associated MSTEP is generated. The first behavior card senses DSTEP, activates DHALT, runs its application for that cycle, then deasserts DHALT. In this example, that is the extent of the first behavior card's purpose, so it will do this repeatedly for each DSTEP pulse. The second behavior card does nothing because no MSTEP occurs. The NDAS card, in response to this DSTEP, communicates the first portion of multiplexed data with the non-user model portion of the emulator logic. In the emulator/accelerator, MSTEP is sensed as an input to the user model portion, and since it is not asserted, all user model logic is disabled from updating. The non-user model logic, of which one portion controls handshaking, with the NDAS, is always active when DSTEP occurs, so data is transferred successfully with the NDAS. Because the NDAS knows it has another data transfer to complete before the next MSTEP can occur, it keeps MHALT asserted before deasserting DHALT.

The DSTEP occurring at time 52 initiates the second data transfer between the non-user model logic portion and the NDAS. Because MHALT is still asserted, only DSTEP occurs. As they should, the first behavior card updates, while the second behavior card does not. On the NDAS, after the data is transferred to the NDAS memory, it must also transfer the data to the workstation memory so it will be available for the NDAS application when the next MSTEP occurs. To prevent the master panel step generator from running too soon, the NDAS extends the DHALT signal until the data is in workstation memory. Also, because the NDAS knows it is ready for the next MSTEP, it deasserts MHALT before deasserting DHALT.

By time 54, all RTAUs have deasserted their MHALTs and DHALTs. Therefore, the step generator asserts both MSTEP and DSTEP as soon as SUM_DHALT and SUM_MHALT become deasserted. Because MSTEP is active, all three RTAUs update, along with the user model logic in the emulator/accelerator. This returns the state of the emulation to essentially the same as that at time 48. Similarly, the state at time 56 is essentially the same as that at time 50.

In accordance with still another aspect of the invention, under control of microprocessor 60, counter circuit 72 (FIG. 2) can be programmed to "skip steps." In many instances of hardware emulations, there is no fixed relationship between domain steps and model steps. If RTAU 14 is of a type that synchronizes with model steps, it may or may not have more time to process a behavior model than if it were to synchronize with domain steps. If multiple domain steps occur for a model step, the behavior application will have more time to process the current behavior cycle. If no domain steps occur between model steps, the application must finish processing in one emulation cycle (i.e., a domain step). Nevertheless, there are instances of hardware emulations in which a fixed relationship between the emulation cycle and the behavior cycle is known. For example, an emulated device may be of the type known as a "two latch" device, such as that used in many IBM LSSD-based designs. In a two-latch device, rather than a D-type flip-flop holding data, a pair of latches operates in a latch-1/latch-2 relationship under the control of two separate clocks of differing phases. Such a device, when emulated on this system, may span two model steps. In other words, only on every other model step does data propagate through the user model combination logic representing the whole of the two-latch device; on the other model step only latch -1-to-latch-2 transfers occur, which are normally not useful to the behavior application. Thus, it is known that it takes two emulation (MSTEP) cycles to complete one useful user model cycle; data never propagates completely through the device on the first cycle. With this knowledge, it can be appreciated that allowing emulator/accelerator 16 processing to span two MSTEP cycles for every time RTAU 14 runs one cycle gives the behavior application running an RTAU 14 more time to process data. By programming counter circuit 72 to assert the appropriate halt signal output only every $n^{th}$ step signal (where n is an integer greater than zero), RTAU 14 effectively ignores or skips steps yet retains lockstep synchronization with the rest of the system by regaining synchronization with the STEP/HALT protocol at the end of the skip step interval. The skipped steps may be either model steps or domain steps or both, depending upon the operation of RTAU 14 and how it is programmed to respond to MSTEP and DSTEP.

Another instance in which step-skipping may be useful is in modeling a dynamic ram (DRAM) or similar device in which several cycles are required before data is output. In a DRAM, a first cycle may transfer the row address, a second may transfer the column address, and a third may transfer the data. In an emulation where physical pin limitations of the DRAM do not need to be enforced, there may be no reason why the three items of information cannot all be transferred from emulator/accelerator 16 to RTAU 14 on the first cycle. The behavior application running on RTAU 14 can program counter circuit 72 (FIG. 2) to regain synchronization several cycles later, then store (or retrieve) the data. Since the translation of emulated memory address to real memory address and subsequent data movement to and from emulator/accelerator 16 may take more than one MSTEP, using step-skipping can extend the amount of time the behavior application operates concurrently with the emulated model. In summary, step-skipping allows the behavior model to remove itself from the emulation environment for a fixed or preprogrammed number of steps, yet maintain synchronization with it.

Figure 10A:
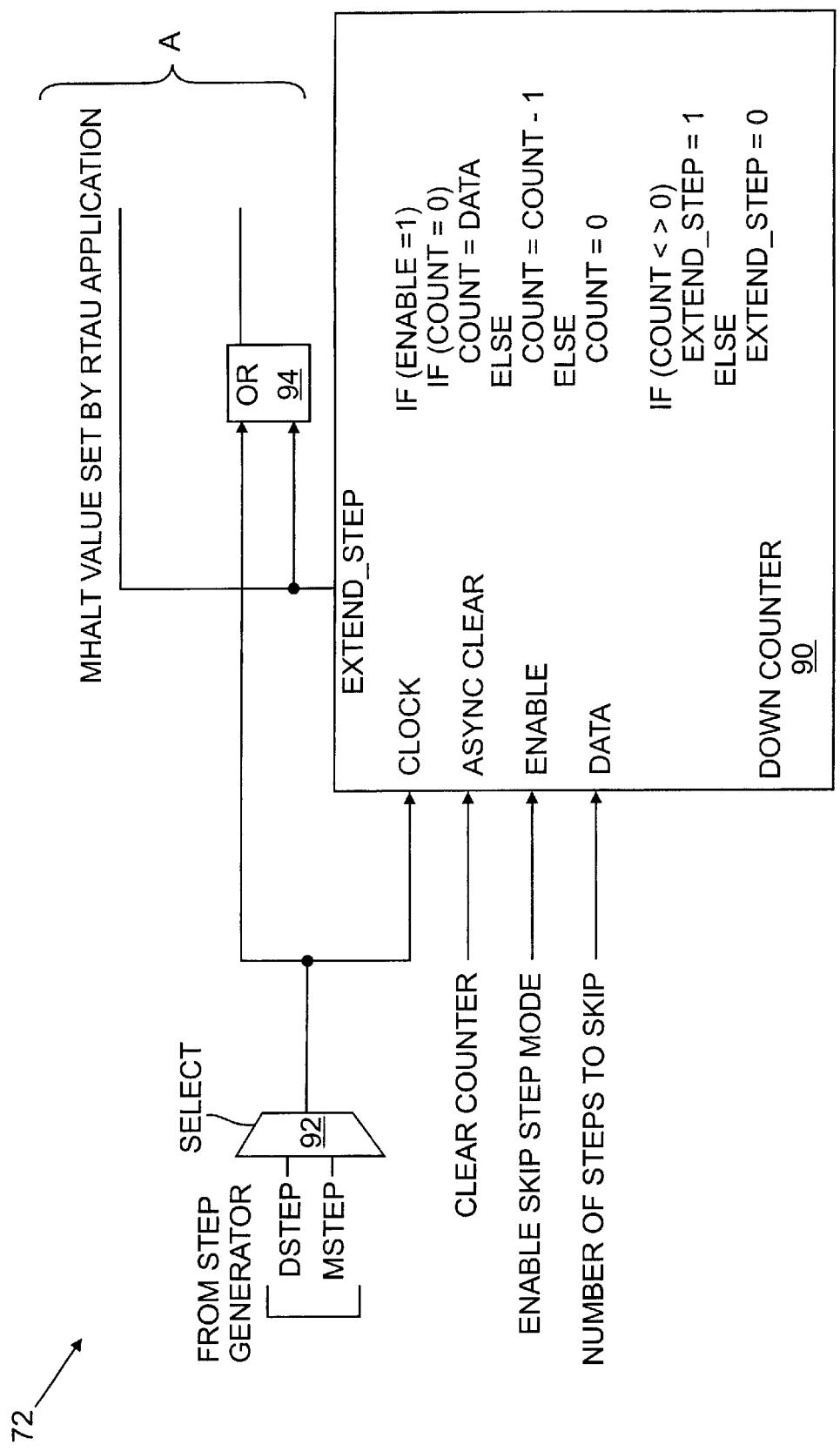
FIG. 10 comprising FIG. 10A
FIG. 10B is a block diagram of the counter circuit that provides the step-skipping feature.
Figure 10B:
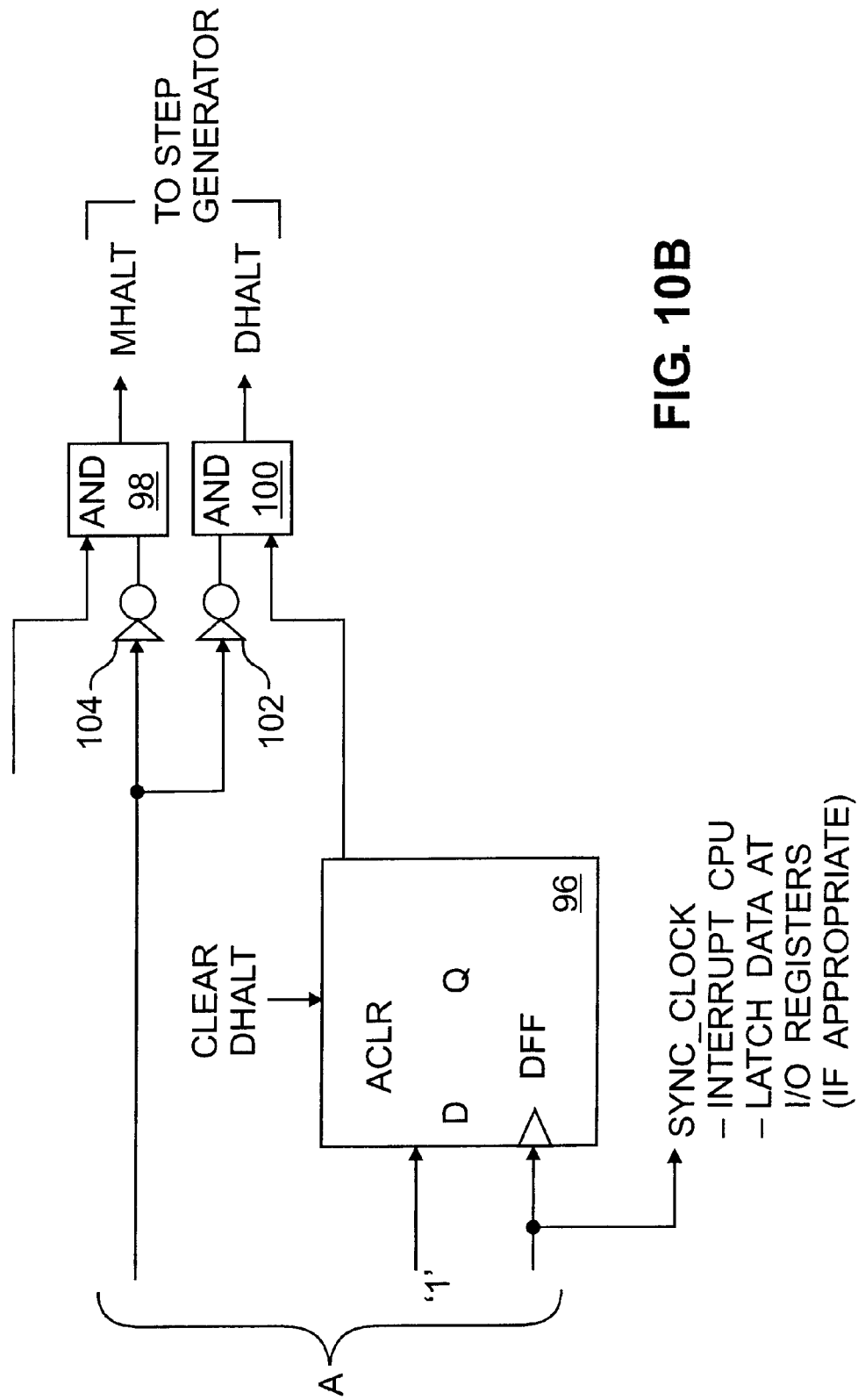

Counter circuit 72 (FIG. 2) is illustrated in further detail in FIG. 10. A down counter 90 forms the heart of counter circuit 72. Under RTAU application program control, microprocessor 60 (FIG. 2) provides several inputs to down counter 90, either directly or via suitable "glue logic" (not shown for purposes of clarity): enable skip step mode; number of steps to skip; and clear counter. By similar means, other inputs are provided to circuit 72 under program control, including: an MHALT value; a clear DHALT signal; and a DSTEP/MSTEP select signal. Circuit 72 outputs MHALT and DHALT as well as a signal sync_clock that may be used to interrupt microprocessor 60 and latch data at data interface 66. Counter 90 has a data input that receives and preloads it with the number of steps to skip. It also has an enable input that receives the enable skip step mode signal and an asynchronous clear input that receives the clear counter signal. Its output is referred to as an extend_step signal. Operation of counter 90 is described by the pseudo-code illustrated within it.

Other circuit elements include: a multiplexer or selector 92 that selectively provides either MSTEP or DSTEP to counter 90 and other logic in response to the above referenced DSTEP/MSTEP select signal; a logical-OR element (e.g., gate) 94, a D-type flip-flop 96; two logical-AND elements 98 and 100; and two inverter elements 102 and 104. The output of selector 92 is provided to the clock input of counter 90 and to one of the two inputs of logical-OR element 94. The other input of logical-OR element 94 receives the extend_step signal. The extend_step signal is also provided to each of inverters 102 and 104. The outputs of inverters 102 and 104 are provided to one of the two inputs of each of logical-AND elements 98 and 100. The output of logical-OR element 94 is the sync_clock signal, which is also provided to the clock input of flip flop 96. The D input of flip-flop 96 is held high or active, and its output is provided to the other input of logical-AND element 100. The other input of logical-AND element 98 receives the MHALT value set under program control. The output of logical-AND element 98 is MHALT. The output of logical-AND element 100 is DHALT. Although the above described circuit elements illustrate the requisite functionality, there may be other or somewhat different circuit elements that are not illustrated for purposes of clarity but would be included in an actual circuit design.

Figure 11:
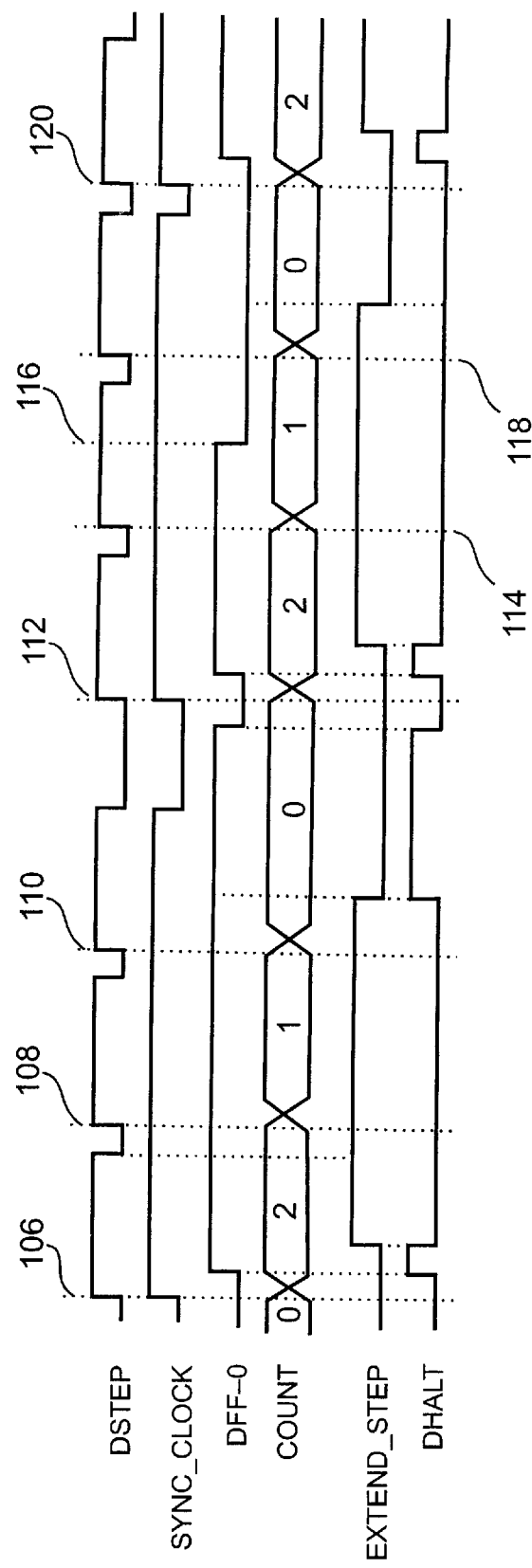
FIG. 11 is a timing diagram illustrating operation of the step skipping feature.

The manner in which counter circuit 72 provides the step-skipping feature is illustrated by the exemplary timing diagram of FIG. 11. Prior to time 106, counter 90 is enabled and cleared. When DSTEP is asserted, sync_clock follows, which may be used elsewhere in the RTAU to "wake up" the application. It also causes flip-flop 96 to latch a "1" or logic-high and hold it until the program clears it. Counter 90 is loaded with the number of steps to skip, which then causes extend_step to become active or asserted. Extend_step causes DHALT to be deasserted prematurely, thus enabling the next step cycle at time 108. It also keeps sync_clock active after DSTEP is deasserted so that the next DSTEP pulse (time 108) will not cause any undesirable downstream actions to occur, such as reinterrupting microprocessor 60. At time 108, the second DSTEP pulse occurs. Counter 90 is decremented. Because counter 90 has not reached zero, extend_step continues to maintain sync_clock in an asserted or active state and DHALT in a deasserted or inactive state.

At time 110, the third DSTEP occurs. Counter 90 decrements to zero. In response, extend_step is deasserted, allowing normal operations to resume. Sync_clock is returned to following DSTEP so that at the end of this cycle it will be reset or deasserted and thus able to detect the rising edge of the next DSTEP at time 112. Also, the output of flip-flop 96 ("DFF-Q") is allowed to regain control over DHALT. Note that because the application has not finished yet and cleared flip-flop 96, the next DSTEP at time 112 will be delayed until the application finishes and clears flip-flop 96.

At time 112, because counter 90 has not been disabled, the logic will reengage immediately on the next DSTEP. Operation continues as described above with respect to time 106.

Time 114 indicates the second DSTEP of the second sequence, which occurs as described above with respect to time 108. However, note that this time the application finishes while the logic is still engaged (time 116). Even though the output of flip-flop 96 is deasserted or inactive and the application program is ready for the next DSTEP, the next DSTEP (time 118) will not be acted upon because sync_clock continues to be forced active by extend_step.

At time 120 the third DSTEP occurs, and counter 90 once again reaches zero and extend_step is deasserted. Now, however, because the output of flip-flop 96 has already been cleared, DHALT is not reasserted. Therefore, the next DSTEP (time 120) follows immediately after the current DSTEP.

The above-referenced patent also describes a STOPPED signal that the behavior card asserts to indicate that the emulation should be suspended. Emulation maybe suspended, for example, if it encounters an error condition. In that event, workstation 10 can detect assertion of STOPPED and handle the error in accordance with its error-handling programming. In a system having multiple behavior cards, assertion of STOPPED by a behavior card also notifies the other behavior cards that it has stopped the emulation. In a system such as that described in the above-referenced patent, one of the behavior cards may itself have error-handling capability. In that case, the behavior card handling the error condition must communicate with the other behavior cards to ascertain which card caused the stoppage and obtain information from it. Nevertheless, determining the status may be slow and inefficient because some of the other behavior cards may be busy continuing to perform other tasks and may not respond to network messages immediately. Also, network messages typically introduce minimum latencies, which, in an emulation environment, can dramatically reduce overall performance. In accordance with the present invention, the simple STOPPED signal is replaced with two signals: SIGNAL_ANY and SIGNAL_ALL, as illustrated in FIGS. 1 and 2. A RTAU 14 asserts a SIGNAL_OUT signal to indicate it is stopping or at least temporarily suspending the emulation. On master panel 12, signal combiner logic 20 both logically-ORs together and a logically-ANDs together the SIGNAL_OUT signals produced by all RTAUs 14. The result of the logical-OR operation is SIGNAL_ANY, which signifies that at least one RTAU 14 asserted its SIGNAL_OUT. The result of the logical-AND operation signifies that all RTAUs 14 have asserted their SIGNAL_OUT signals. The SIGNAL_ANY and SIGNAL_ALL signals are fed back to each RTAU 14. Each RTAU 14, in response to detecting assertion of SIGNAL_ANY, asserts its SIGNAL_OUT. Thus, when one RTAU 14 asserts its SIGNAL_OUT, the resulting SIGNAL_ANY causes all other RTAUs 14 to subsequently assert their SIGNAL_OUTs. When all RTAUs 14 have asserted their SIGNAL_OUTs, signal combiner logic 20 asserts SIGNAL_ALL. One of RTAUs 14 that has error-handling capability is programmed to respond to assertion of SIGNAL_ALL. At that time, the RTAU 14 that is programmed to handle or service the error condition is assured that all other RTAUs 14 have stopped processing and are awaiting network commands. The error-handling RTAU 14 can then issue network commands to the other RTAUs 14 without interference or delay.

In accordance with another feature of the invention, RTAU reset logic 22 on master panel 12 is coupled to each RTAU 14 by a separate reset line. By asserting a RESET signal on a reset line of a selected RTAU 14, reset logic 22 can selectively reset one RTAU 14 and not affect the others. This feature is useful in cases where the behavior application running on the RTAU 14 leaves microprocessor 60 (FIG. 2) in a "hung" or otherwise unresponsive state, or in non-error situations where the user wants to ensure RTAU 14 starts from a known state before starting another test case.

Figure 7:
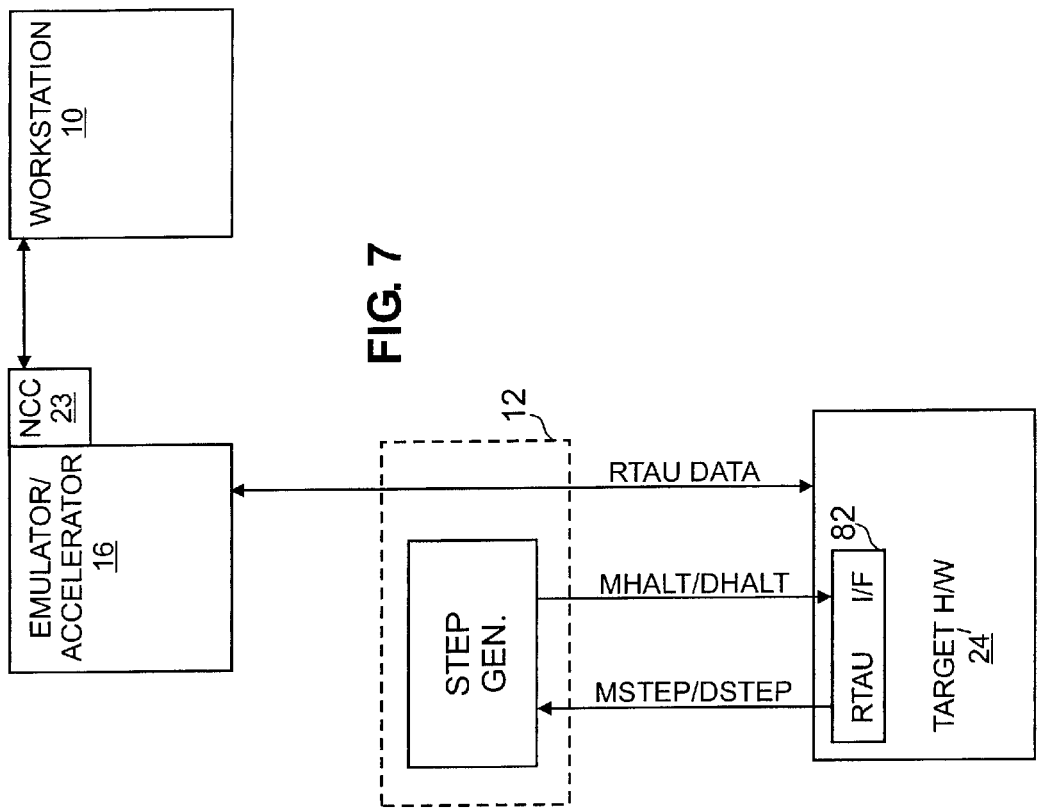
FIG. 7 is a block diagram of yet another alternative configuration of the emulation system.
Figure 6:
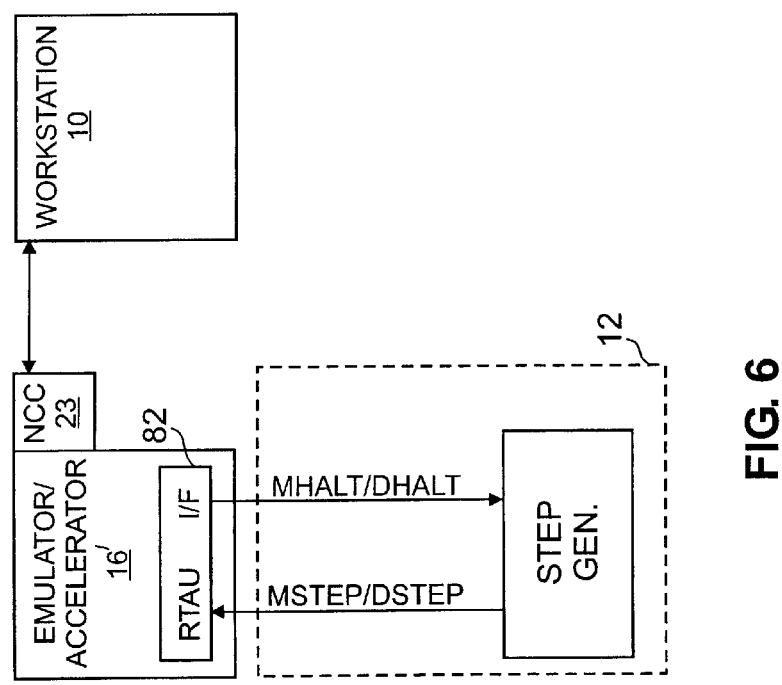
FIG. 6 is a block diagram of still another alternative configuration of the emulation system.

Still other RTAU embodiments are feasible. For example, as illustrated in FIG. 5, a RTAU may be part of a networked control card (NCC) 23' that, but for the RTAU interface and data transfer capability, is similar to networked control card 23 (FIG. 1). This configuration may be advantageous in embodiments in which emulator/accelerator 16' is an IBM ETX because NCC 23' has local access to the ETX support bus. As illustrated in FIG. 6, in another exemplary embodiment the RTAU interface 82 is included in an emulator/accelerator 16' itself. For example, it can be implemented in the same type of logic description as that in which the emulation model is implemented, e.g., VHDL. An example of a function suitable for this type of RTAU might be a bus monitor that monitors the activity of a bus in the emulated model. If it needs to, the bus monitor model can enable DSTEP to occur by deasserting DHALT while not advance the user model by asserting MHALT. Still another example of the versatility of the RTAU interface is illustrated in FIG. 7. In this example, the RTAU interface 82 is included as part of target hardware 24'.

As illustrated in FIG. 3, several master panels 12', 12" and 12''' can be cascaded together to form a global master panel that accommodates more emulator/accelerators and more RTAUs than a single master panel could accommodate. Although not illustrated in FIG. 1 (master panel 12) for purposes of clarity, each of master panels 12', 12" and 12'" has splitter circuitry 80 that splits or distributes DSTEP into multiple signal lines (destinations) and combiner circuitry 82 that combines, using a logical-OR operation, DHALT signals received on multiple signal lines (sources) into the single DHALT signal described above with respect to FIGS. 1 and 2. (The ellipses ("...") shown vertically between pairs of such signal lines are intended to indicate the omission from the drawing, for purposes of clarity, of other such lines that are between the two illustrated.) Likewise, splitter circuitry 80 also distributes MSTEP into multiple signal lines, and combiner circuitry 82 combines MHALT signals received on multiple signal lines into a single MHALT signal. Each also has splitter circuitry 84 and 86 that splits and distributes to multiple signal lines the SIGNAL_ANY and SIGNAL_ALL signals, respectively. Similarly, each master panel also combines the SIGNAL_OUT signals received on multiple lines using the logical-AND operation and logical-OR operation described above with respect to FIG. 1. Although they are identical in structure, in the illustrated configuration master panel 12' is programmed to function in a primary master panel mode, and master panels 12" and 12'" are programmed to function in a secondary master panel mode.

Step generator circuitry 18 of primary master panel 12' perform the functions described above with respect to FIGS. 1 and 2. Although secondary master panels 12" and 12'" also have step generator circuitry 18, where included in the global master panel configuration that circuitry 18 is programmed to operate in a bypassed mode. Accordingly, step generator circuitry 18 of master panels 12" and 12'" is bypassed, and master panels 12" and 12'" receive their MSTEP and DSTEP signals from primary master panel 12' and pass them through, via splitter circuitry 80, to multiple emulator/accelerators and RTAUs via multiple MSTEP and DSTEP signal lines. Similarly, because their step generator circuitry 18 is bypassed, secondary master panels 12" and 12'" do not generate any MHALT or DHALT signals themselves; rather, they receive multiple MHALT and DHALT signals from the RTAUs to which they are connected and pass these signals through, via combiner circuitry 82, to primary master panel 12' via a single MHALT signal line and a single DHALT signal line. Although in a preferred global master panel, a primary master panel feeds up to 24 secondary master panels, only two secondary master panels 12" and 12'" are shown in FIG. 3 for purposes of clarity.

It should be noted that each master panel (e.g., 12, 12', 12", 12'") includes multiple instances of step generator circuitry 18, although only one is illustrated for purposes of clarity. Preferably there are sixteen of step generator circuitry 18 on each master panel. As described above, in the global master panel configuration, only one of them is used on the master panel designated as "primary," and the rest are bypassed. Nevertheless, the splitters 80 associated with the bypassed instances of step generator circuitry 18 are not bypassed and can be used if necessary by wrapping signals around to them from the secondary master panels.

Furthermore, it should be noted that the unused DHALT, MHALT and SIGNAL_OUT input signal lines of the emulator/accelerator boards are preferably masked by programming associated registers (not shown) to reflect the used and unused inputs. An emulator/accelerator board may have, for example, 80 of each such input signal line. In the example above, where only two secondary master panels are used, many such inputs would be masked. Including registers for this purpose facilitates quick and easy reconfiguration.

As illustrated by the above-described embodiments, the present invention improves upon the behavior card-based emulation system by redefining the behavior card interface as a more versatile and generalized "RTAU" interface and expanding the types of RTAUs beyond merely behavior cards. The versatile RTAU interface is characterized by dual handshaking signal pairs: MSTEP/MHALT and DSTEP/DHALT. The dual handshaking protocol enhances versatility by enabling a wider variety of RTAUs to be used. Indeed, it enables different types of RTAUs to be used together in the same system, such as behavior cards and NDAS cards. In another aspect, the invention improves upon the system stoppage protocol used in the earlier behavior card-based system by more efficiently alerting other RTAUs when one RTAU has caused the emulation to stop. In still another aspect, the invention enhances scalability of the emulation system by providing for cascading master panels to accommodate a greater number of RTAUs.

It will be evident that there are numerous embodiments of the present invention, which, while not specifically described above, are clearly within the scope and spirit of the invention. Consequently, the above description is considered to be exemplary only, and the full scope of the invention is to be determined solely by the appended claims.

What is claimed is:

1. A hardware design emulation system, comprising:
    an emulator associated with a workstation external to said emulation system, said emulator programmable with executable logic having a user model portion defining a hardware design and a non-user-model portion reflecting peripheral system functions;
    a handshaking controller associated with said emulator producing a domain step signal and a model step signal, said domain step signal indicating said emulator is entering a state for executing a portion of its logic, and said model step signal indicating said emulator is entering a state for advancing said user model executing on said emulator; and
    a run-time assist unit (RTAU) external to said emulator performing a portion of said emulation and communicating emulation data with said emulator, said RTAU producing a domain halt signal and a model halt signal in response to said domain step signal and said model step signal received from said handshaking controller, said handshaking controller not producing said domain step and model step signals again until said RTAU deasserts said domain halt and model halt signals.

2. The hardware design emulation system claimed in claim 1, wherein said RTAU is a behavior card.

3. The hardware design emulation system claimed in claim 1, wherein:
    said RTAU is a network-based direct attach stimulus (NDAS) card with time-multiplexed input/output data signals;
    said emulator asserts and deasserts said domain step signal a plurality of times to effect transfers of data directly between said NDAS card and said workstation, each assertion of said domain step signal initiating a transfer of a portion of a data block, said NDAS card asserting said model halt signal until the data block has been transferred.

4. The hardware design emulation system claimed in claim 1, wherein said RTAU includes a counter circuit, said counter circuit controllable by a program executing on said RTAU to inhibit assertion of said model halt signal in response to assertion of said model step signal a predetermined programmable number of times and inhibit assertion of said domain halt signal in response to assertion of said domain step signal a predetermined programmable number of times.

5. A hardware design emulation system, comprising:

an emulator associated with a workstation external to said emulation system, a user model of a hardware design executable on said emulator under control of said workstation;

a plurality of run time assist units (RTAUs) external to said emulator, each RTAU performing a portion of said emulation and communicating emulation data with said emulator, any of the RTAUs producing an output signal to indicate it has suspended execution of a program, each RTAU receiving an "Any" signal indicating that another of said plurality of RTAUs asserted its output signal and an "All" signal indicating that all of said plurality of RTAUs asserted their output signals, each RTAU asserting its output signal in response to detecting assertion of said "Any" signal; and a logic network having OR logic combining said output signals produced by said plurality of RTAUs and AND logic combining said output signals produced by said plurality of RTAUs, said OR logic producing said "Any" signal and said AND logic producing said "All" signal.

6. The hardware design emulation system claimed in claim 5, wherein an RTAU enters a state for communication with said workstation in response to detecting assertion of said "Any" signal.

7. The hardware design emulation system claimed in claim 5, wherein one of said plurality of RTAUs executes a program that detects assertion of said "All" signal and, in response, initiates a recovery procedure.

8. A hardware design emulation system, comprising:

an emulator associated with a workstation external to said emulation system, a user model of a hardware design executable on said emulator under control of said workstation; and a plurality of run time assist units (RTAUs) external to said emulator, each performing a portion of said emulation and communicating emulation data with said emulator; and a logic network having OR logic combining said output signals produced by said plurality of RTAUs and AND logic combining said output signals produced by said plurality of RTAUs, said OR logic producing said "Any" signal and said AND logic producing said "All" signal.

9. A hardware design emulation system, comprising:

a plurality of master panels, each providing a mechanical framework and connections for power and data signals;

a plurality of emulators, each associated with one of said master panels and with a workstation external to said emulation system, a user model of a portion of a hardware design executable on each emulator under control of said workstation;

a first handshaking controller included in a primary one of said master panels having a step signal generator producing a domain step signal and a model step signal, said domain step signal indicating said emulator is entering a state for executing a portion of its logic, said model step signal indicating said emulator is entering a state for advancing a user model executing on said emulator, said first handshaking controller having a domain step splitter circuit distributing said domain step signal to a plurality of output connections, said handshaking controller having a model step splitter circuit distributing said model step signal to a plurality of output connections, said handshaking controller having a domain halt combiner circuit combining a plurality of signals received at a plurality of input connections to produce said domain halt signal, and said handshaking controller having a model halt combiner circuit combining a plurality of signals received at a plurality of input connections to produce said model halt signal;

a second handshaking controller included in a secondary one of said master panels having a bypassed step signal generator, said second handshaking controller receiving said domain step signal and model step signal from said primary one of said master panels, said second handshaking controller having a domain step splitter circuit distributing said received domain step signal to a plurality of output connections, said second handshaking controller having a model step splitter circuit distributing said received model step signal to a plurality of output connections, said handshaking controller having a model halt combiner circuit combining a plurality of signals received at a plurality of input connections to produce said model halt signal received at one of said input connections of said primary one of said master panels, and said handshaking controller having a domain halt combiner circuit combining a plurality of signals received at a plurality of input connections to produce said domain halt signal received at one of said input connections of said primary one of said master panels;

a plurality of run-time assist units (RTAUs) external to said emulator, each performing a portion of said emulation and communicating emulation data with said emulator, each RTAU connected to said secondary master panel and producing a domain halt signal and a model halt signal in response to said domain step signal and said model step signal received from said second handshaking controller, said secondary master panel passing said domain step and model step signals produced by said first handshaking controller to said plurality of RTAUs and passing said domain halt and model halt signals received from said plurality of RTAUs to said first handshaking controller.

10. A hardware design emulation system, comprising:

an emulator associated with a workstation external to said emulation system, a user model of a hardware design executable on said emulator under control of said workstation;

a handshaking controller associated with said emulator producing a domain step signal and a model step signal, said domain step signal indicating said emulator is entering a state for executing a portion of its logic, and said model step signal indicating said emulator is entering a state for advancing said user model executing on said emulator;

a plurality of run time assist units (RTAUs) external to said emulator, each RTAU performing a portion of said emulation and communicating emulation data with said emulator, said RTAUs producing a domain halt signal and a model halt signal in response to said domain step signal and said model step signal received from said handshaking controller, said handshaking controller not producing said domain step and model step signals again until said RTAUs deasserts their respective said domain halt and model halt signals; and reset logic having a unique signal line associated with each RTAU for resetting a selected RTAU independently of other RTAUs.

* * * * *